United States Patent [19]

Schwarzbauer

[11] Patent Number: 4,903,885
[45] Date of Patent: Feb. 27, 1990

[54] METHOD AND APPARATUS FOR FASTENING ELECTRONIC COMPONENTS TO SUBSTRATES

[75] Inventor: Herbert Schwarzbauer, Munich, Fed. Rep. of Germany

[73] Assignee: Siemens Aktiengesellschaft, Berlin and Munich, Fed. Rep. of Germany

[21] Appl. No.: 317,558

[22] Filed: Mar. 1, 1989

[30] Foreign Application Priority Data

Mar. 3, 1988 [DE] Fed. Rep. of Germany ....... 3806979

[51] Int. Cl.$^4$ ...................... H01L 21/58; B23K 20/02
[52] U.S. Cl. .................................... 228/106; 228/193; 228/243; 228/263.12
[58] Field of Search ........... 228/106, 193, 248, 263.12, 228/243; 419/49

[56] References Cited

U.S. PATENT DOCUMENTS

| 3,501,832 | 3/1970 | Iwata et al. | 228/180.2 |
| 3,669,333 | 6/1972 | Coucoulas | 228/106 X |
| 4,756,752 | 7/1988 | Barnard | 419/49 X |
| 4,810,672 | 3/1989 | Schwarzbauer | 228/263.12 |

FOREIGN PATENT DOCUMENTS 0242626 10/1987 European Pat. Off. .

Primary Examiner—Kenneth J. Ramsey
Attorney, Agent, or Firm—Hill, Van Santen, Steadman & Simpson

[57] ABSTRACT

A pressure sintering method and apparatus provides that surfaces to be joined are pressed together with a pressure of at least 900 N/cm$^2$ at a sintering temperature upon the interposition of a metal powder paste which serves to fasten electronic components, such as power semiconductors, to substrates. Components having a structured upper side can be pressure sintered when they are inserted into a receptacle chamber closed by a movable die together with a member of elastically deformable material, such as silicone rubber, which transmits the sintering pressure. The deformable member completely fills out the remaining space of the receptacle chamber when the sintering pressure reached.

4 Claims, 1 Drawing Sheet

METHOD AND APPARATUS FOR FASTENING ELECTRONIC COMPONENTS TO SUBSTRATES

BACKGROUND OF THE INVENTION

1. Field of the Invention

The present invention is directed generally to a method for fastening electronic components to substrates by pressure sintering and also to an apparatus for implementing the method.

2. Description of the Related Art

A method and apparatus for pressure sintering is disclosed in European patent application EP-A 0,242,626. An arrangement composed of a substrate and of component is introduced into a press and a first intermediate layer of aluminum and a second intermediate layer of molybdenum is provided between an upper side of the component and one of the press rams to protect the upper of side of the component from physical damage during the actual pressing event. For components having a structured or cleft upper side, however, the pressing event leads to great distortions in the semi-conductor body even using the disclosed intermediate layers. Such distortions may result in the destruction of the component.

SUMMARY OF THE INVENTION

An object of the present invention is to provide a method by which components having a structured or non-planar upper side may be secured to a substrate by pressure sintering without physical damage to the component or to the upper side thereof. This and other objects of the invention are achieved by providing a deformale member of temperature resistant, elastically deformable material that is inserted into a receptacle between the pressing rams into which the component and substrate are placed.

An advantage obtainable with the method of the invention is that the deformable member composed of temperature resistant, elastically deformable material transmits the pressure required for pressure sintering to the parts to be joined to one another in a completely uniform fashion even with a high degree of structuring of the upper side of the component so that a uniform and durable connection between the component and the substrate is achieved.

An apparatus for implementing the method of the invention is also provided wherein a receptacle into which the component and substrate are placed includes a floor part, lateral wall parts, and a die movable in the direction of the floor part to form a closed chamber. The receptacle is placed between first and second pressing rams of a press and a deformable member is placed in the receptacle member with the component and substrate before the die closes the chamber.

Further advantages are provided by a sealing ring pressing against an inside of the lateral wall parts. The sealing ring is supported against an edge of the die to prevent the escape of the deformable member. Alternately, the die has an advanced edge which embraces the lateral wall parts and a sealing ring is provided pressing against an inside of the advanced edge and supported against an edge of the lateral wall parts. Although described herein as a sealing ring, it is, of course, desired that the sealing ring have a shape corresponding to the shape of the lateral wall parts, whether round, rectangular or of some other shape. The deformable member of a preferred embodiment is in two parts with a first of the two parts being annular, or at least having an opening at the center and corresponding to the shape of the closed chamber, and being inserted into receptacle adapted to surround the component. A second of the two parts is composed of a plate-shaped member and is inserted above the component to cover the top thereof.

Additional advantages are provided by means for heating the press ram against which the floor part is supported to produce the sintering temperature or by having the die composed as a part of the second press ram. The deformable member may be composed either of a silicone rubber or a temperature resistant elastomer.

DESCRIPTION OF THE PREFERRED EMBODIMENTS

Figure 1:
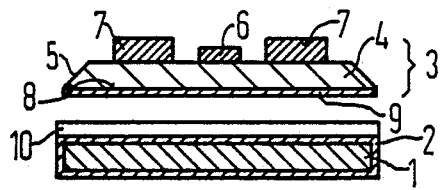
FIG. 1 is a cross section of a semiconductor component and substrate to be joined using the method and apparatus of the present invention.

In FIG. 1 is shown a substrate 1 which is, for example, a 1.5 mm thick wafer of molybdenum having a diameter of approximately 29.6 mm. On all sides of the substrate 1 is provided a voltaically applied contact layer 2 which has a thickness of between about 2 to 3 micrometers and is composed, for example, of silver. A semiconductor component 3 to be secured to the substrate 1 is shown above the substrate 1. The component 3 is, for example, composed of a silicon member 4 having a lateral bevelled edge 5. The invention can also be carried out on components having more intricately structured top surfaces. The exemplary component 3 is a power semiconductor, such as a thyristor, and includes an electrode 6 which serves the purpose of igniting or triggering and, as warranted, of quenching the thyristor, as well as an electrode 7 at a cathode side which is situated on the upper surface of the silicon member 4. After the thyristor component 3 has been joined to the substrate 1, the latter electrode 7 forms the anode side electrode.

An underside surface 8 of the silicon member 4 is coated with a layer sequence that, in detail, is composed of an aluminum layer having a thickness of approximately 1 micrometer, a titanium layer applied thereon having a thickness of approximately 100 nanometers, a middle layer of, for example, nickel or platinum lying thereover and having a thickness of approximately 500 nanometers, and finally, an outside silver layer having a thickness of approximately 200 nanometers. For the sake simplicity, FIG. 1 shows only the outer silver layer 9 which serves as a contacting layer.

For fastening the component 3 on the substrate 1, a paste 10 is applied on the contact layer 2 as a layer having a thickness of 10 through 100 micrometers, and preferably a thickness of approximately 20 micrometers. The paste 10 is initially manufactured from a material comprising a silver powder having plate-like powder particles with a grain size below or equal to about 15 micrometers and a powder density of approximately 1.9 g/ml. The silver powder is suspended in cyclohexanol as a solvent in a weight ratio of approximately 2:1 to form a paste which may be applied by silk screening. Subsequently, the paste 10 is degassed in a vacuum to avoid the formation of bubbles during drying. After being applied to either the component or the substrate by silk screening, the paste 10 is dried by driving off the solvent. The drying time for the paste layer amounts to approximately 30 minutes at room temperature, but to only a few minutes at higher temperatures. Not only can the paste 10 be applied to the substrate 1 or to the component 3, but it can also be applied to both the substrate and component.

After the paste 10 has dried, the substrate 1 and component 3 are heated to a temperature which amounts to at least 100 degrees C to completely dry the paste 10. Either preceding or following this preheating, the component 3 has its contacting layer 9 put in place on the completely dried paste 10 on the substrate 1, or alternately the component and paste placed on the substrate.

Figure 2:
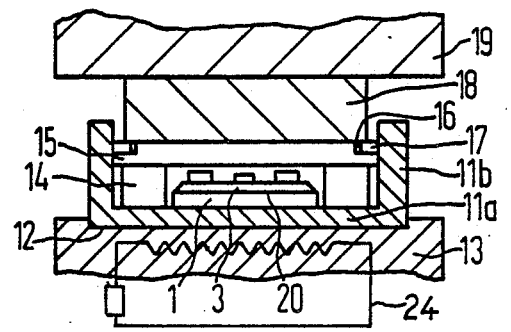
FIG. 2 is a cross section of a arrangement suitable for implementing the method of the present invention.

The arrangement formed of the substrate 1 and component 3 are together placed into a metallic, pot-shaped receptacle means 11a and 11b as shown in FIG. 2. The receptacle means is composed of a floor part 11a and of a lateral wall part 11b and is seated in a recess 12 in a press ram 13. The press ram 13 forms a part of a press, such as a hydraulic press, details of which are not shown. A deformable member 14 is shaped, for example, as a circular ring and is composed of a temperature resistant, elastically deformable material, such as silicone rubber or of some other temperature resistant material, especially a fluoridated elastomer. The deformable material is placed into the receptacle means 11a and 11b so that it surrounds the arrangement of parts 1 and 3 and also centers the arrangement.

A further part 15 in the shape of a wafer or plate and composed of the same material as the first part 14 or of some other elastically deformable material is then inserted into the interior of the receptacle means 11a and 11b so that it closes off this receptacle in an upward direction. A sealing ring 17 of, for example, a metal, ceramic, or plastic is inserted into an annular recess 16 in the second part 15. The sealing ring 17 presses tightly against inside of the lateral wall part 11b. By placing a metallic die 18 onto the sealing ring 17 or onto the surface of the second part 15, the receptacle means 11a and 11b is then augmented to form a closed receptacle chamber. The die 18 is movable in the direction of the floor part 11a, the die 18 being supported against a second press ram 19 which resides opposite the first press ram 13.

The first press ram 13 is heated by a heater 24 so that the substrate 1 and component 3 are brought to a desired sintering temperature of, for example, 230 degrees C. The press rams 13 and 19 are moved toward one another by actuating the press so that the die 18 penetrates more deeply into the interior of the receptacle means 11a and 11b, whereby the parts 14 and 15 are elastically deformed.

Figure 3:
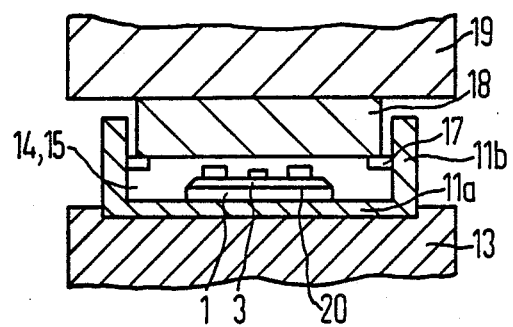
FIG. 3 is a cross section of the arrangement of FIG. 2 during the transmission of pressure onto the assembled substrate and semiconductor element.

In FIG. 3 is shown the position of the press rams 13 and 19 in which a pressure of at least 900 N/cm$^2$ required for sintering is exerted while maintaining the sintering temperature. The volume of the deformable parts 14 and 15 is so dimensioned that they completely fill out the interior of the receptacle chamber 11a and 11b which is not occupied by the substrate 1 and the component 3. The parts 14 and 15 also prevent direct contact between the die 18 and the component part 3. Despite the different heights of the electrodes 6 and 7 and the structured surface of the component 3 established by the bevel 5, the parts 1 and 3 are successively pressed against one another with a constant pressure over an entire area 20 at which they abut one another so that completely uniform joining of the parts derives. The elastic deformation of the parts 14 and 15 is so extensive that the transmission of the pressure onto the component surface is completely uniform; however, without having parts of the elastically deformable material 14 and 15 penetrate into the gap between the substrate 1 and component 3 which is filled by the compressed paste 10. Thus, not only are the parts 1 and 3 joined at the middle of the area 20, but a faultless joining of the parts 1 and 3 in the immediate edge region of this gap is also achieved. The emergence of the parts 14 and 15 of the elastically deformable material between the lateral wall part 11b and the die 18 is expediently prevented by the presence of the sealing ring 17. Thus, the deformable material is not squeezed out of the closed chamber. The behavior of the elastically deformable parts 14 and 15 may be described as "quasihydrostatic".

A good connection between the substrate 1 and component 3 by pressure sintering is achieved in that a pressure of at least 900 N/cm$^2$ is exerted on the combination 1 and 3 at a sintering temperature of, for example, 230 degrees C. over a sintering time of approximately one minute. However, it should be pointed out that adequate results are already achieved at sintering times of only a few seconds and that the pressure can also be increased to about 1 through 2 t/cm$^2$. A sintering temperature which lies in a range which has a lower limit value of approximately 150 degrees C. and an upper limit value of about 250 degrees C. is preferred. It should be emphasized that the pressure sintering is undertaken in a normal atmosphere and it is not necessary to employ an protective atmosphere.

After sintering, the combined arrangement 1 and 3 is removed from the receptacle chamber 11a, 11b and 8 whereby the elastic parts 14 and 15 resume their original shape as shown in FIG. 2. They are then available for use in pressure sintering of numerous other component-substrate arrangements. Instead of the elastic parts 14 and 15 that are set for above, and that are annularly and planarly shaped, a single part composed of the same material may also be used within the framework of the invention insofar as the volume thereof corresponds to that of the two parts 14 and 15. It is, of course, possible to use a greater number of deformable parts as well.

Figure 4:
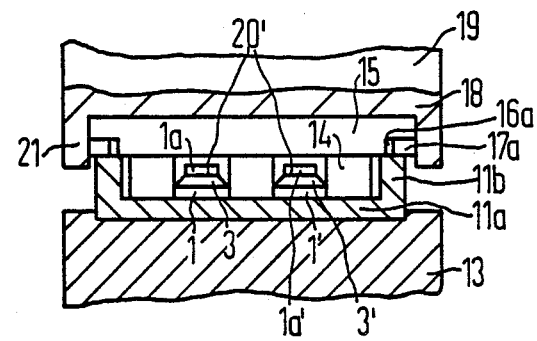
FIG. 4 is a cross section of a further arrangement suitable for implementing the method of the invention.

With reference to FIG. 4, a modification of the arrangement of FIGS. 2 and 3 is shown wherein a die 18 is movable in the direction of the floor part 11a and has an advanced edge 21 which embraces the lateral wall part 11b of the receptacle means. FIG. 4 corresponds to FIG. 2 wherein the position of the press rams 13 and 19 is such that a sintering pressure is not yet exerted on the arrangements therein. In FIG. 4, two arrangements comprising a substrate 1 and component 3 and a further substrate 1' and a further semiconductor component 3' are shown. For example, however, the arrangements 1 and 3 and 1' and 3' do not necessarily differ from those of FIG. 1 although each may include a further substrate 1a and 1a' in the region of their upper boundary surfaces. The connections of the substrates 1a and 1a' also ensues on the basis of pressure sintering with appropriate pastes that are applied to the contact layers at gaps 20' and are dried.

Deformable parts 14' and 15' are shown in their nondeformed condition in FIG. 4 and have an elasticity which makes it possible to pressure sinter the arrangements 1 and 3 and 1' and 3' in one pressing event even though the components mentioned, and particularly the component heights, are different. It is expedient in the arrangement of FIG. 4 to place the second deformable part 15' as a plate into the interior of the movable die 18 which is formed by the projecting edge 21 and to hold it in position with a sealing ring 17a which lies in a recess 16a. The first deformable part 14' is expediently formed as a circular wafer which is provided with recesses for the arrangements 1 and 3 and 1' and 3'. The arrangement of FIG. 4 is advantageously fashioned so that the die 18 is movable in the direction of the floor part 11a, the die 18 being formed as a part of the press ram 19.

The pressure sintering process which has been set forth proceeds as a solid-state reaction without the appearance of liquid phases. The method as set forth is especially well suited for fastening large-area power semiconductors manufactured in MOS technology and provided with MOS structures to a substrate. Apart therefrom, great advantages also achieved by utilizing the method of the invention to fasten other electronic components to substrates.

In a departure from the above disclosed embodiments, the paste 10 composed of a metal powder and of solvent can also be applied to the contact layer 9 of the component 3 instead of being applied onto the contact layer 2 of the substrate 1 or may also be applied to both layers 1 and 9. What is critical in all of these modifications is that the parts 1 and 3 not be placed against one another and pressure-sintered until after complete drying of the paste 10 because high adhesion and low electrical transfer resistances of the connections can only be achieved in this way.

Thus, there is disclosed a method and apparatus for pressure sintering components to substrates wherein a member of elastically deformable material is provided in a receptacle between the rams of press to transmit the sintering pressure to the component without contact between the component and die. This is accomplished by providing a deformable member of such size that it completely fills out the remaining interior space of the receptacle chamber when the sintering pressure is reached.

Although other modifications and changes may be suggested by those skilled in the art, it is the intention of the inventors to embody within the patent warranted hereon all changes and modifications as reasonably and properly come within the scope of his contribution to the art.

I claim:

1. A method for fastening an electronic component to a substrate by pressure sintering, comprising the steps of:
    applying a paste of a metal powder and of a solvent to a boundary surface having a contact layer to be fastened between the component and the substrate;
    completely drying said paste applied at the boundary surface;
    placing the component in place on the substrate;
    placing the component and the substrate into a receptacle composed of a floor part and of a lateral wall part that is augmented by a die which is movable in a direction toward said floor part to form a closed receptacle chamber, said floor part being supported against a first press ram and said die being supported against a second press ram;
    placing a deformable member of temperature resistant elastically deformable material into said receptacle; pressing together said first and second pressing rams at a sintering temperature and at a pressure of at least 900 N/cm$^2$, said deformable member having a volume which completely fills an interior of the receptacle chamber not occupied by the component and the substrate when said pressure is reached so that direct contact between said die and the component and substrate is avoided.

2. A method as claimed in claim 1, wherein said electronic component is a large-area power semiconductor.

3. A method as claimed in claim 1, wherein said paste is applied on the component.

4. A method as claimed in claim 1, wherein said paste is applied on the substrate.

* * * * *